United States Patent
Twu et al.

(10) Patent No.: US 6,197,669 B1
(45) Date of Patent: Mar. 6, 2001

(54) REDUCTION OF SURFACE DEFECTS ON AMORPHOUS SILICON GROWN BY A LOW-TEMPERATURE, HIGH PRESSURE LPCVD PROCESS

(75) Inventors: Jih-Churng Twu, Chung-Ho; Syun-Ming Jang; Chen-Hua Yu, both of Hsin-Chu, all of (TW)

(73) Assignee: Taiwan Semicondcutor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/292,361

(22) Filed: Apr. 15, 1999

(51) Int. Cl.[7] .................. H01L 21/3205; H01L 21/4763; H01L 21/20; B05D 3/04
(52) U.S. Cl. .................. 438/585; 438/482; 438/386; 427/309; 427/578; 427/600
(58) Field of Search .................. 438/585, 386; 427/309, 578, 600

(56) References Cited

U.S. PATENT DOCUMENTS

| 5,470,619 | * 11/1995 | Ahn et al. ............................. 427/578 |
| 5,504,019 | 4/1996 | Miyasaka et al. ..................... 437/40 |
| 5,569,502 | * 10/1996 | Koinuma et al. ..................... 427/600 |
| 5,652,156 | 7/1997 | Liao et al. ............................. 437/40 |
| 5,677,211 | 10/1997 | Kaneko ................................. 437/40 |
| 5,767,004 | 6/1998 | Balasubramanian et al. ........ 438/592 |
| 5,789,030 | * 8/1998 | Rolfson ................................. 427/309 |
| 5,858,852 | * 1/1999 | Aiso et al. ............................ 438/396 |
| 5,913,125 | * 6/1999 | Brouillette et al. .................. 438/386 |

* cited by examiner

Primary Examiner—John F. Niebling
Assistant Examiner—Viktor Simkovic
(74) Attorney, Agent, or Firm—George O. Saile; Stephen B. Ackerman

(57) ABSTRACT

A method is provided for depositing an amorphous silicon thin film on a substrate. The method is carried out in a reactor chamber and can be a LPCVD, PECVD or RTCVD process. The method comprises introducing a gas species into the reactor chamber for a time sufficient to dehydrate the substrate and to form a thin layer of silicon on the substrate. Following formation of the thin layer of silicon, a dopant gas is introduced into the reactor chamber to form the doped silicon thin film. The temperature and pressure within the chamber is set to minimize formation of surface irregularities or pits within the thin amorphous silicon layer.

15 Claims, 6 Drawing Sheets

REDUCTION OF SURFACE DEFECTS ON AMORPHOUS SILICON GROWN BY A LOW-TEMPERATURE, HIGH PRESSURE LPCVD PROCESS

BACKGROUND OF THE INVENTION (1) Field of the Invention

This invention relates to the field of semiconductor manufacturing, and more specifically to an improved method for depositing amorphous silicon thin film on a semiconductor substrate.

(2) Description of the Prior Art

Thin films of amorphous and polycrystalline silicon are widely used in semiconductor manufacturing. For example, amorphous silicon can be used for the formation at the gate of CMOS structures for application in the dual gate process since the amorphous silicon can effectively reduce the Boron (B) penetration from the gate to the device region. Doped polycrystalline silicon can be used to form interconnects, gate electrodes, emitter structures and resistors. These silicon thin films are typically formed by LPCVD (low pressure chemical vapor deposition) by decomposition of a silicon gas such as silane ($SiH_4$) or disilane ($Si_2H_6$). Doping can also be accomplished in the gas phase by introducing a dopant gas such as diborane ($B_2H_6$), arsine ($AsH_3$) or phosphine ($PH_3$). The deposition temperature during LPCV is typically from 500 degrees C. to 675 degrees C. and the pressure is typically from 200 mTorr to 2 Torr. The crystalline structure of the 'as deposited' film is largely a function of the deposition temperature. At temperatures below about 550 degrees C. the 'as deposited' films have an amorphous structure. At temperatures between about 550 degrees C. and 580 degrees C. there is a transition between amorphous silicon and polycrystalline silicon. Hemispherical grain (HSG) polysilicon is typically grown in this transitional range. At temperatures above about 580 degrees C. the 'as deposited' films have a polycrystalline structure.

In addition to LPCVD, there are other methods for depositing thin films of amorphous and polycrystalline silicon. One such method is plasma-enhanced chemical vapor deposition (PECVD) and rf induced glow discharge is used to transfer energy into the reactant gases. Advantages of PECVD include lower substrate temperatures and higher deposition rates. A representative temperature range for PECVD of silicon thin films is about 350 degrees C. to 450 degrees C. Another method of depositing amorphous and polycrystalline silicon thin films is RTCVD (rapid thermal chemical vapor deposition). With RTCVD the structure is typically rapidly heated by lamps and the reactant gases are introduced.

One problem that occurs during deposition of in-situ doped amorphous or polycrystalline silicon thin film is the degradation of the underlying substrate film by reaction of the dopant species with contaminants on the substrate. Specifically, an underlying substrate can be attacked by acidic gasses formed by the dopant species during the deposition process. For example, with a phosphine ($PH_3$) dopant, phosphoric acid ($H_3PO_4$) can be generated by the reactor of phosphine ($PH_3$) with oxygen ($O_2$) or water ($HO_2$) present in the substrate or in the reaction chamber. Phosphoric acid is highly corrosive and can attack an underlying film such as silicon nitride ($Si_3N_4$).

These problems are compounded by the increased use of HSG or rugged polysilicon. This type of polysilicon increases the surface area and the 'trapping' area on the substrate for contaminants. In addition, during CVD of silicon, the deposition process does not occur immediately upon introduction of the reactant gasses. This gives the reactant gasses time to combine with corrosive by-products, which can attack the unprotected substrate.

In view of the foregoing, it is the objective of the present invention to provide an improved method for depositing doped amorphous and polycrystalline silicon thin films without degradation of the underlying substrate film.

In the conventional process of depositing amorphous silicon film, a pressure of 11 pa is used while the temperature is set at 550 degrees C. The present invention provides for adjusting these two processing parameters in order to obtain optimum processing results in depositing amorphous silicon.

U.S. Pat. No. 5,677,211 (Kaneko), U.S. Pat. No. 5,504,019 (Miyasakaet al.), U.S. Pat. No. 5,652,156 (Liao et al.), U.S. Pat. No. 5,767,004 (Balasubramanian et al.) and U.S. Pat. No. 5,789,030 (Rolfson) shows amorphous silicon deposition techniques.

SUMMARY OF THE INVENTION

According to the present invention, the invention teaches a low temperature, high pressure LPCVD amorphous silicon film deposition process to reduce surface defects. This reduction in surface defects is accomplished by implementing a novel method for the deposition of amorphous silicon using the LPCVD process. The conventional processing conditions for forming amorphous silicon film leads to irregularities or pits in the surface of the amorphous silicon film. This presents serious problems because these surface pits can cause oxide deposition to take place on the surface of the film, which leads to device failure. By lowering the deposition temperature and increasing the deposition pressure, these parameters of temperature and pressure can be manipulated such that the pitting of the surface of the amorphous silicon film is eliminated.

Conventional methods use a pressure of 11 pa. (particulate air) and a temperature of 550 degrees C. for the deposition of amorphous silicon. It has been found that increasing the pressure from 11 pa causes a decrease in the formation of the surface pitting. It has also been found that decreasing the temperature from 550 degrees C. causes a decrease of the formation of the surface pitting.

By combining these two observations an optimum condition of operating temperature and pressure can be established such that the surface pitting is reduced to a minimum. From the indicated observations it is clear that, in order to reach this optimum operating condition, the operating temperature must be lower than the conventional 550 degrees C. while the operating pressure must be higher than the conventional 11 pa.

DETAILED DESCRIPTION OF THE PREFERRED EMBODIMENT

Figure 1A:
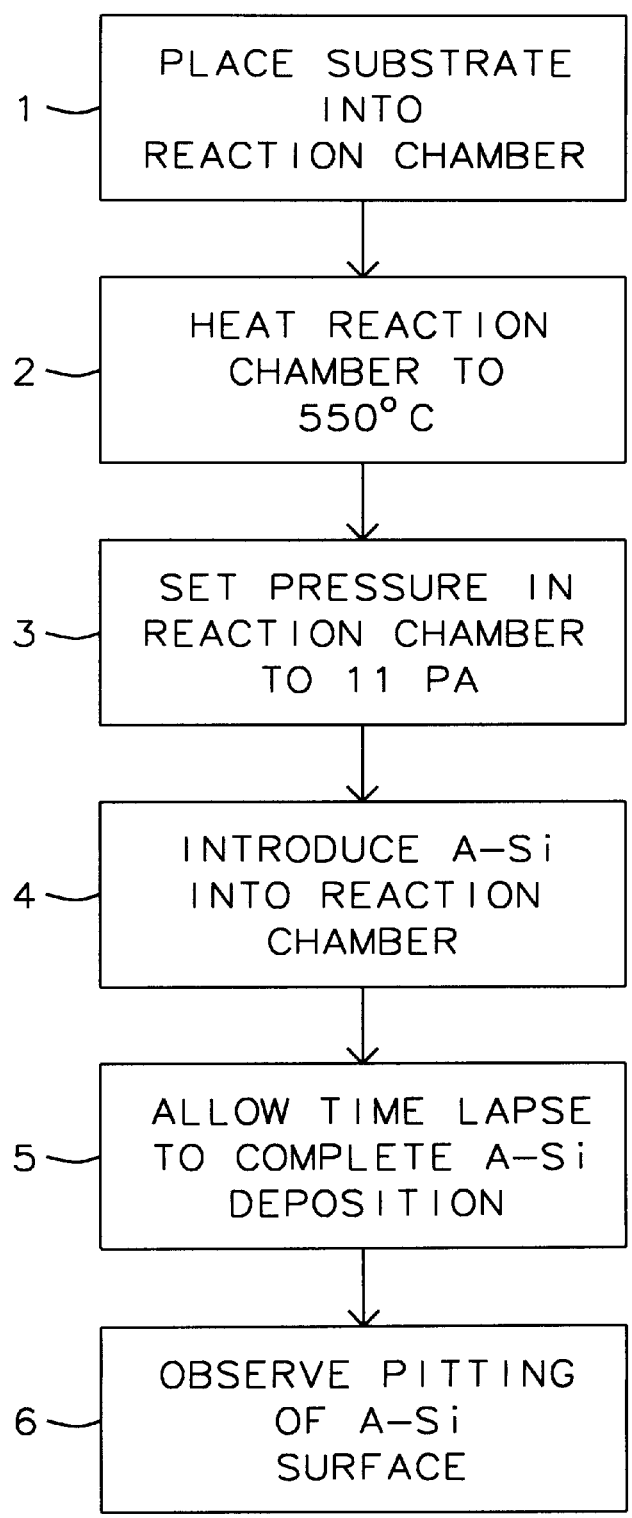
FIGS. 1a through 1c show a series of experiments conducted within the scope of the present invention where the reactive chamber pressure is varied while the deposition temperature is held constant.

Referring now more specifically to FIG. 1a, there is shown the sequence of steps taken to observe amorphous silicon film surface pitting under the operating conditions of 550 degrees C. temperature and 11 pa of pressure. These operating conditions are the conditions of pressure and temperature in force within the reactor chamber wherein the amorphous film is being deposited. The operating conditions in force for the experiment of FIG. 1a are changed and adjusted to gain insight into what effect the reactor chamber temperature and pressure have on the formation of pits or surface irregularities during the amorphous silicon film deposition. The substrate is first positioned inside the reactor chamber after which the temperature is set at 550 degrees C. (FIG. 1a, step 2) and the pressure at 11pa (FIG. 1a, step 3). After enough time has elapsed for the stabilization of these conditions of temperature and pressure throughout the reactor chamber, the amorphous silicon is released into the reactor chamber (FIG. 1a, step 4) and the substrate is exposed to the amorphous silicon. This process of amorphous silicon film deposition is allowed to come to completion (FIG. 1a, step 5) after which the wafer is removed from the reactor chamber. The top surface of the amorphous silicon film deposited on top of the wafer is now examined for surface pitting (FIG. 1a, step 6).

It must be noted that all other conditions for activating the reactor chamber, such as voltage applied to the top and to the bottom plate of the reactor chamber, remain constant during the experiments and are therefore not considered as having any influence or significance relative to these experiments.

Figure 1B:
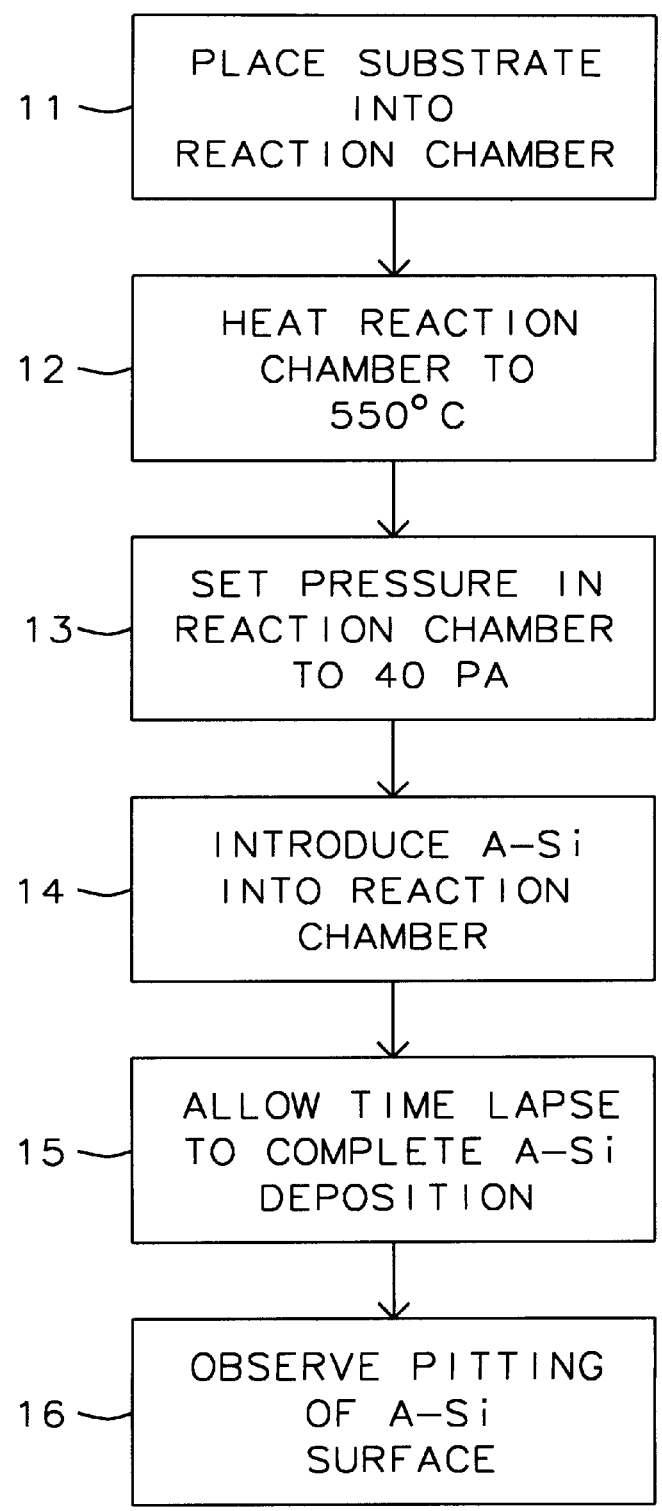

The sequence of experiments as describe above under FIG. 1a is now repeated, see FIG. 1b, but with a pressure setting of 40 pa while the temperature is held constant at 550 degrees C. The observation of the surface of the amorphous silicon film (FIG. 1b, step 6) revealed a considerable decrease in the pitting of the film surface confirming that increasing pressure while keeping temperature constant resulted in a decrease of the pitting of the film surface.

The preceding step (FIG. 1b) was extended by further increasing the pressure, this time to 70 pa, while the temperature within the reactor chamber was held constant at 550 degrees C. The examination of the amorphous film surface (FIG. 1c, step 6) indicated further reduction yet in the pitting of the surface of the film.

Figure 1C:
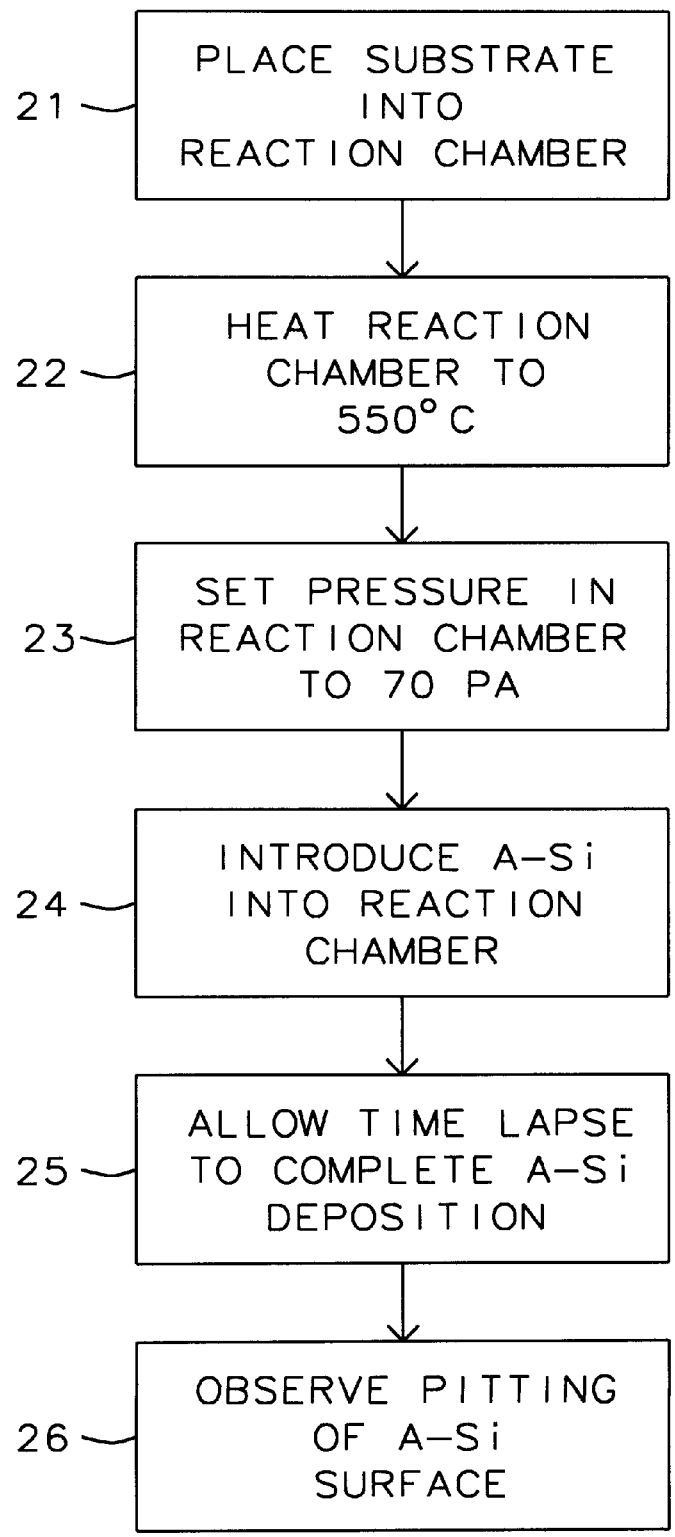

In sum, the sequence of experiments detailed by the sequence of FIG. 1a, FIG. 1b and FIG. 1c indicates that increasing the pressure within the reactor chamber while keeping all other operating parameters, most notably the operating temperature, constant resulted in a significant reduction of the formation of surface irregularities described as pits within the surface of the amorphous silicon deposited on top of the substrate.

Figure 2A:
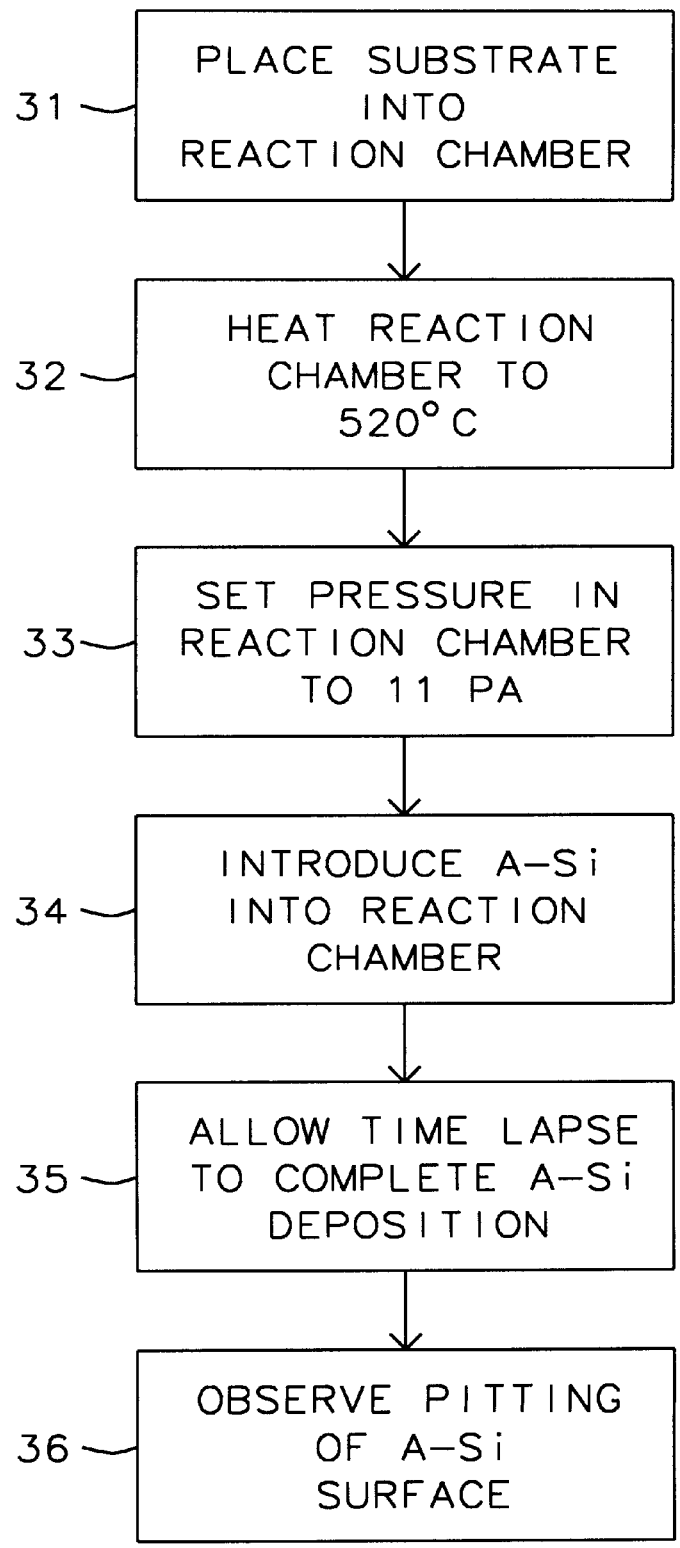
FIGS. 2a through 2c show a series of experiments conducted within the scope of the present invention where the reactive chamber pressure is varied while the deposition temperature is lowered as compared to the set of experiments conducted within the scope of FIG. 1.
Figure 2B:
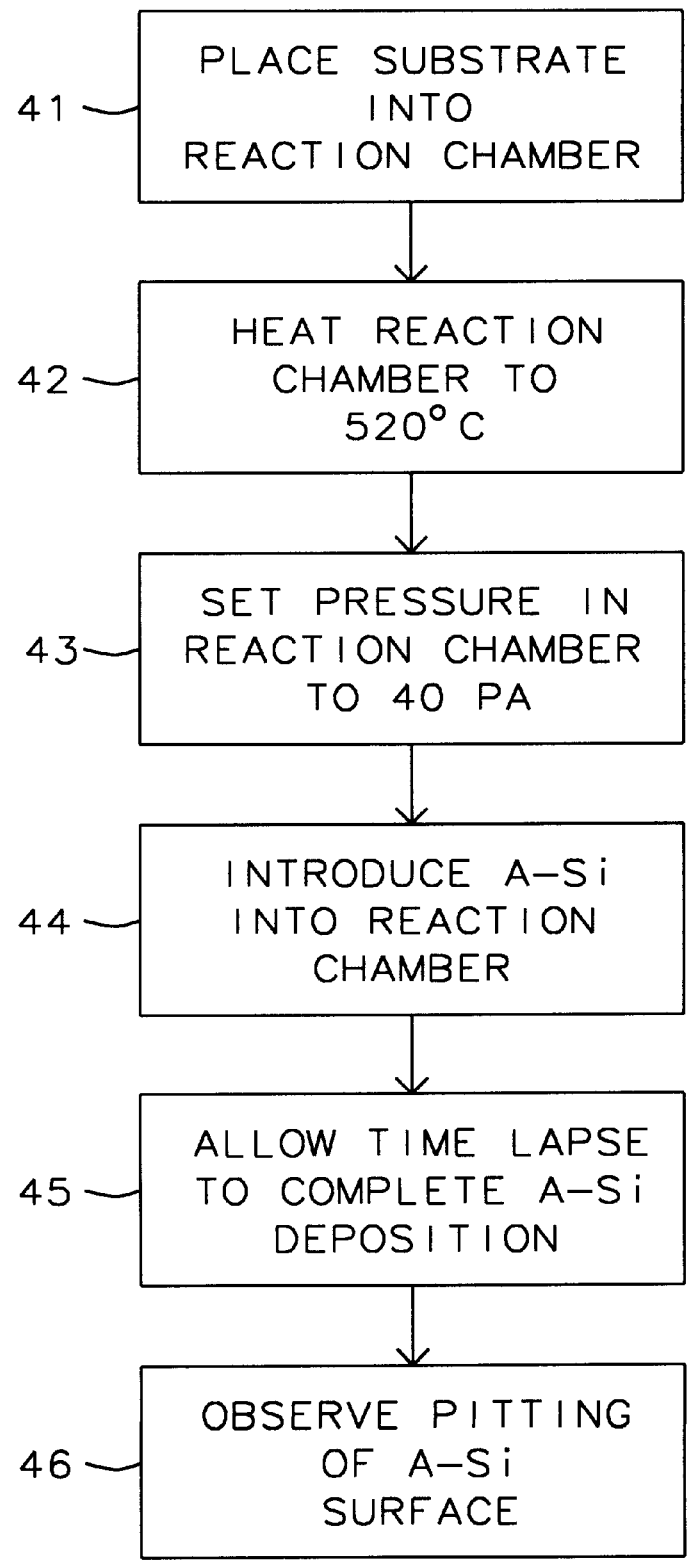
Figure 2C:
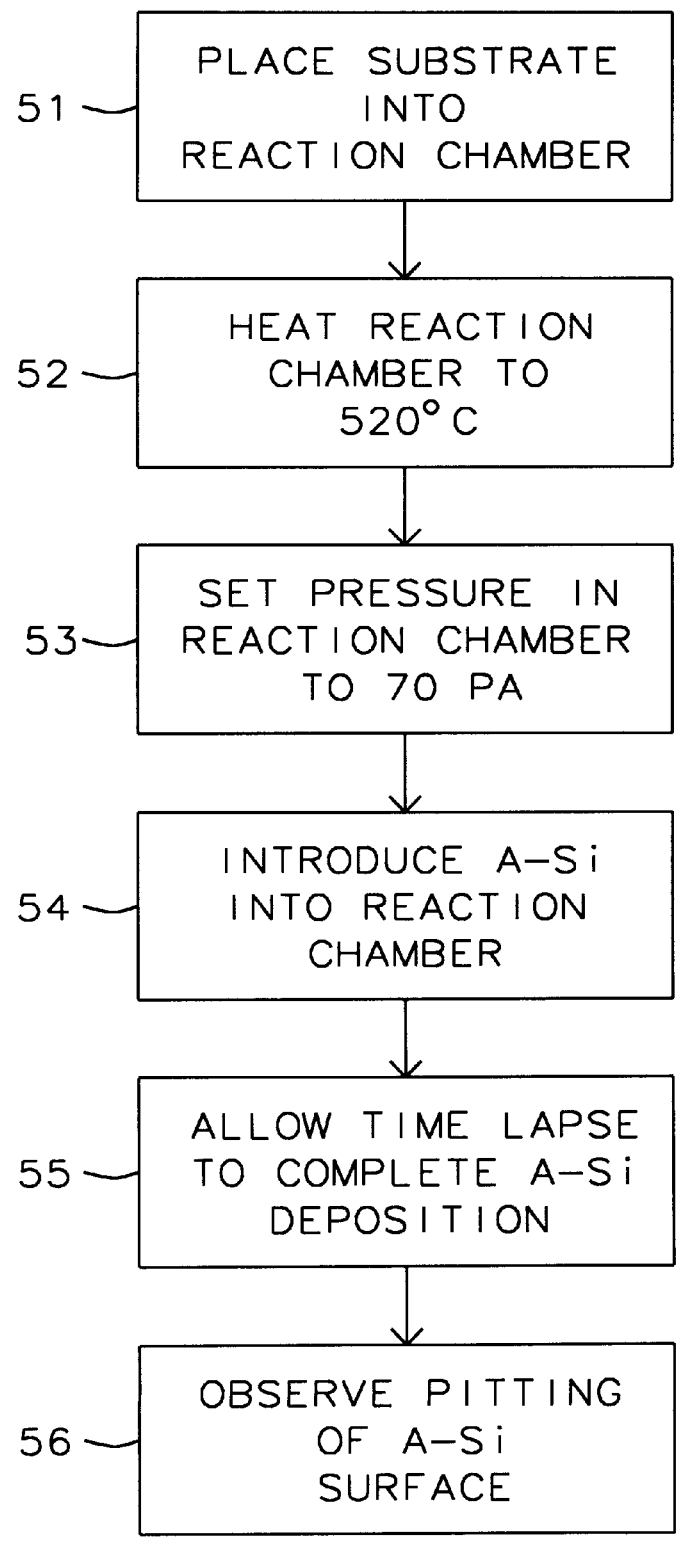

The sequence of experimental steps highlighted in FIG. 2a, FIG. 2b and FIG. 2c investigate the effect of a decrease in temperature (within the reactor chamber) on the formation of irregularities or pits on the surface of the deposited amorphous silicon.

Referring now more specifically to FIG. 2a, there is shown the sequence of experiments taken to observe amorphous silicon film surface pitting under the operating conditions of 520 degrees C. temperature and 11 pa of pressure. These operating conditions are, as before, the conditions of pressure and temperature in force within the reactor chamber wherein the amorphous film is being deposited. The operating conditions in force for the experiment of FIG. 2a are changed and adjusted to gain insight into what effect the reactor chamber temperature and pressure have on the formation of pits or surface irregularities during the amorphous silicon film deposition. The substrate is first positioned inside the reactor chamber (FIG. 2a, step 1) after which the temperature is set at 520 degrees C. (FIG. 2a, step 2) and the pressure at 11pa (FIG. 2, step 3). After enough time has elapsed for the stabilization of these conditions of temperature and pressure throughout the reactor chamber, the amorphous silicon is released into the reactor chamber (FIG. 2, step 4) and the substrate is exposed to the amorphous silicon. This process of amorphous silicon film deposition is allowed to come to completion (FIG. 2, step 5) after which the wafer is removed from the reactor chamber. The top surface of the amorphous silicon film deposited on top of the wafer is now examined for surface pitting (FIG. 2a, step 6). It must be noted that all other conditions for activating the reactor chamber, such as voltage applied to the top and to the plate of the reactor chamber, remain constant during these experiments and are therefore not considered as having any influence or significance relative to the phenomenon being studied.

The operational conditions for activating the reactor chamber for the experiments as described under the invention are as follows:

a flow rate of $SiH_4$ or $Si_2H_6$ of 0.01 to 1.0 cc/minute dopant can either be omitted or boron or phosphorous can be used as dopant the reactor chamber is a low pressure system with a SiC tube or quartz tube time for the completion of the experiment is dependent on the film thickness that is required, the time is generally within the range of between 1 and 10 hours voltage applied is within the range of between 0 and 20 volts.

The sequence of experiments as describe above under FIG. 2a is now repeated, see FIG. 2b, but with a pressure setting of 40 pa while the temperature is held constant at 520 degrees C. The observation of the surface of the amorphous silicon film (FIG. 2b, step 6) revealed a considerable decrease in the pitting of the film surface as compared to the surface pitting observed after the completion of the experiments described under FIG. 2a. This indicates that increasing pressure while keeping temperature constant resulted in a decrease of the pitting of the film surface.

The preceding step (FIG. 2b) was extended by further increasing the pressure, this time to 70 pa, while the temperature within the reactor chamber was held constant at 520 degrees C. The examination of the amorphous film surface (FIG. 2c, step 6) indicated further reduction yet in the pitting of the surface of the film.

In sum, the sequence of experiments detailed by the sequence of FIG. 2a, FIG. 2b and FIG. 2c indicated that decreasing the temperature within the reactor chamber further amplified the effect (observed within the series of experiments shown under FIG. 1) of a reduction on amorphous film surface pits if the pressure within the creation chamber is increased.

This latter effect is further verified by cross verification of, for instance, FIGS. 1b with 2b.

The difference in operating conditions in force for these two experiments is that the temperature is lower in the experiment conducted for FIG. 2b while the pressure for both experiments was set at 40 pa.

It was observed by comparing the pitting of the deposited amorphous film that there is less pitting after the experiment conducted for FIG. 2b than there is for the experiment conducted for FIG. 1b further emphasizing the beneficial effect of the reduction in temperature on the pitting of the surface of the deposited amorphous film.

The same comparisons were made between the surface pitting of the amorphous silicon film at the end of the experiments described under FIG. 1a and FIG. 2a and between FIG. 1c and FIG. 2c. The same results were obtained relating to the effect of temperature reduction, that is lowering the temperature while keeping the pressure the same results in less pitting of the surface of the deposited amorphous film.

While the present invention has been described with reference to the foregoing embodiments, various changes and modifications can be made thereto which fall within the scope of the following claims.

What is claimed is:

1. A method for forming an in-situ amorphous silicon thin film on the surface of a silicon substrate comprising:

securing a reactor said reactor containing a reactor chamber;

placing a substrate in said reactor chamber;

setting the voltage applied between the plates of said reactor chamber;

setting the temperature within said reactor chamber;

setting the pressure within said reactor chamber to a value larger than about 11 pa to reduce pitting of the surface of the amorphous silicon film; and introducing a silicon gas species into the reactor chamber for a time period sufficient to form a layer of amorphous silicon on the surface of said substrate and to remove contaminants from the surface of said substrate, said layer of amorphous silicon having a thickness of from one to several monolayers.

2. The method of claim 1 with the additional step of introducing a dopant gas into the reactor chamber thereby exposing said layer of amorphous silicon to form a doped amorphous silicon thin film said step to be performed concurrent with said step of introducing a silicon gas species into the reactor chamber.

3. The method of claim 2 wherein the dopant gas species contains a gas selected from the group containing boron, phosphorous, phosphine ($PH_3$), diborane ($B_2H_6$) and arsine ($AsH_3$).

4. The method of claim 1 wherein said reactor contains an element selected from the group containing low-pressure chemical vapor deposition (LPCVD) reactors, plasma enhanced chemical vapor deposition (PEVCD) reactors, and rapid thermal chemical vapor deposition (RTCVD) reactors.

5. The method of claim 1 wherein setting the temperature within said reactor chamber is setting the temperature to below about 525 degrees C.

6. The method of claim 1 wherein setting the temperature within said reactor chamber is setting the temperature within the range between 510 and 525 degrees C.

7. The method of claim 1 wherein setting the temperature within said reactor chamber is setting the temperature within the range between 500 and 510 degrees C.

8. The method of claim 1 wherein said time period sufficient to form a layer of amorphous silicon is within the range between 1 and 10 hours whereby said time period is dependent on the thickness of the amorphous silicon layer that is to be deposited.

9. The method of claim 1 wherein said silicon gas species introduced into the reactor chamber contains a gas selected from the group containing silane ($SiH_4$), disilane ($Si_2H_6$), trisilane ($Si_3H_8$) and dichlorosilnae ($SiH_2CL_2$) whereby said silicon gas species is introduced into said reactor chamber at a flow rate within the range of between 0.01 and 1.0 cc per minute.

10. The method of claim 1 wherein the contaminants contain oxygen ($O_2$) and water ($H_2O$).

11. The method of claim 1 wherein the doped thin amorphous film is within the range between about 400 to 3000 angstrom. thick.

12. A method for forming an in-situ doped silicon thin film on a substrate comprising:

securing a semiconductor substrate;

securing a low-pressure reactor said reactor having a reactor chamber;

placing said substrate into said reactor chamber;

adjusting the voltage between the plates of said reactor to a voltage within the range between about 1 and 20 volts;

heating said substrate within the reactor chamber to a temperature within the range of between about 500 and 525 degrees C.;

setting the pressure within the reactor chamber to a pressure within the range of between about 11 and 95 pa; and introducing a silicon gas species containing $SiH_4$ or $Si_2H_6$ into said reactor chamber at a flow rate within the range of between about 0.01 and 1.0 cc/minute for a period of time within the range of between about 1 and 10 hours said period of time being sufficient to form a layer of required thickness of amorphous silicon on the surface of said substrate and to remove contaminants present on the substrate said layer of amorphous silicon having a thickness of from one to several monolayers.

13. The method of claim 12 with the additional step of introducing a dopant gas into the reactor chamber said dopant gas to contain boron or phosphorous thereby forming said doped amorphous silicon thin film said step to be performed concurrent with said introducing a silicon gas species containing $SiH_4$ or $Si_2H_6$ into said reactor chamber.

14. The method of claim 12 wherein said reactor chamber is a LPCVD system equipped with a horizontal SiC tube.

15. The method of claim 12 wherein said reactor chamber is a LPCVD system equipped with a horizontal quartz tube.

* * * * *